(12) United States Patent
Chang et al.

(10) Patent No.: US 11,366,177 B1
(45) Date of Patent: Jun. 21, 2022

(54) LEAKAGE CURRENT DETECTION CIRCUIT AND FLUXGATE DRIVER

(71) Applicants: Kang-Shuo Chang, Taipei (TW); I-Cheng Lu, Yilan County (TW)

(72) Inventors: Kang-Shuo Chang, Taipei (TW); I-Cheng Lu, Yilan County (TW)

(73) Assignee: iSentek Inc., New Taipei (TW)

( * ) Notice: Subject to any disclaimer, the term of this patent is extended or adjusted under 35 U.S.C. 154(b) by 0 days.

(21) Appl. No.: 17/320,245

(22) Filed: May 14, 2021

(30) Foreign Application Priority Data

Apr. 14, 2021 (TW) ................... 110113467

(51) Int. Cl.
| | |
|---|---|
| *H03K 5/24* | (2006.01) |
| *G01R 31/52* | (2020.01) |
| *H02M 7/5387* | (2007.01) |
| *G01R 1/44* | (2006.01) |
| *H03K 3/037* | (2006.01) |

(52) U.S. Cl.
CPC ............ *G01R 31/52* (2020.01); *G01R 1/44* (2013.01); *H02M 7/5387* (2013.01); *H03K 3/037* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 9,035,648 B2 | 5/2015 | Figaro et al. | |
| 9,291,648 B2 | 3/2016 | Snoeij et al. | |
| 10,126,332 B2 * | 11/2018 | Teppan | ................. H01F 38/30 |
| 10,996,245 B2 * | 5/2021 | Plagne | ................. G01R 15/185 |
| 2004/0070899 A1 | 4/2004 | Gershen et al. | |
| 2014/0117995 A1 | 5/2014 | Topucharla et al. | |

(Continued)

FOREIGN PATENT DOCUMENTS

| | | |
|---|---|---|
| DE | 102007032300 | 1/2009 |
| EP | 2980597 | 2/2016 |

(Continued)

OTHER PUBLICATIONS

"Office Action of Taiwan Counterpart Application", dated Nov. 3, 2021, p. 1-p. 4.

(Continued)

*Primary Examiner* — Jeffery S Zweizig
(74) *Attorney, Agent, or Firm* — JCIPRNET

(57) ABSTRACT

A leakage current detection circuit and a fluxgate driver are provided. The leakage current detection circuit is suitable for a fluxgate device. The leakage current detection includes a duty cycle detection circuit, a compensation circuit, and a control signal generation circuit. The duty cycle detection circuit receives a pulse width modulation (PWM) signal from an inverter circuit. The duty cycle detection circuit detects a duty cycle of the PWM signal by sampling the PWM signal with a clock signal to output a count signal. The compensation circuit adjusts a pulse number of the count signal according to an offset signal in a self-test period. The control signal generation circuit calculates an average value of the count signal, and compares the average value with multiple threshold values to respectively generate multiple control signals. The control signals indicate a leakage current state of the fluxgate device.

14 Claims, 7 Drawing Sheets

(56) References Cited

U.S. PATENT DOCUMENTS

| | | |
|---|---|---|
| 2014/0320112 A1 | 10/2014 | Nodera et al. |
| 2015/0042325 A1 | 2/2015 | Snoeij et al. |
| 2016/0334473 A1 | 11/2016 | Snoeij et al. |
| 2017/0350927 A1 | 12/2017 | Gabrielsson et al. |
| 2019/0006020 A1 | 1/2019 | Sundaresan et al. |
| 2019/0377009 A1 | 12/2019 | Plagne et al. |

FOREIGN PATENT DOCUMENTS

| | | |
|---|---|---|
| EP | 3726680 | 10/2020 |
| JP | 2006177973 | 7/2006 |
| TW | 200600808 | 1/2006 |
| TW | 200842389 | 11/2008 |
| TW | 201521132 | 6/2015 |
| TW | 201636624 | 10/2016 |
| TW | 201643450 | 12/2016 |
| WO | 2020218443 | 10/2020 |

OTHER PUBLICATIONS

"Search Report of Europe Counterpart Application", dated Mar. 17, 2022, p. 1-p. 6.

\* cited by examiner

LEAKAGE CURRENT DETECTION CIRCUIT AND FLUXGATE DRIVER

CROSS-REFERENCE TO RELATED APPLICATION

This application claims the priority benefit of Taiwan application serial no. 110113467, filed on Apr. 14, 2021. The entirety of the above-mentioned patent application is hereby incorporated by reference herein and made a part of this specification.

BACKGROUND

Technical Field

This disclosure relates to a leakage current detection circuit and a fluxgate driver, and in particular to a leakage current detection circuit suitable for a fluxgate device.

Description of Related Art

In order to increase the performance and endurance of an electric vehicle, multiple high-voltage batteries connected in series and in parallel have to be used to drive the electric vehicle. However, during driving or charging of the electric vehicle, a leakage current of the electric vehicle may occur due to the road, weather or vehicle conditions, and the leakage current poses a danger that cannot be underestimated to the driver and the surrounding environment. Therefore, there is an increasing demand for leakage current detectors, and interest in this field remains high for those skilled in the art.

SUMMARY

This disclosure provides a leakage current detection circuit, which can detect a leakage current state of a fluxgate device according to a pulse width modulation signal.

In an embodiment of the disclosure, a leakage current detection circuit is suitable for a fluxgate device. The leakage current detection circuit includes a duty cycle detection circuit, a compensation circuit, and a control signal generation circuit. The duty cycle detection circuit receives a pulse width modulation signal from an inverter circuit, detects a duty cycle of the pulse width modulation signal by sampling the pulse width modulation signal with a clock signal, and outputs a count signal. The compensation circuit is coupled to the duty cycle detection circuit, and adjusts a pulse number of the count signal according to an offset signal in a self-test period. The control signal generation circuit is coupled to the compensation circuit, calculates an average value of the count signal, and compares the average value with multiple threshold values to respectively generate multiple control signals. The control signals are configured to indicate a leakage current state of the fluxgate device.

In an embodiment of the disclosure, a fluxgate driver includes an inverter circuit and a leakage current detection circuit. The inverter circuit is coupled to a first side of a fluxgate device, and generates a pulse width modulation signal according to an induced current on the first side. The leakage current detection circuit is coupled to the inverter circuit, and receives the pulse width modulation signal to generate multiple control signals. The leakage current detection circuit includes a duty cycle detection circuit, a compensation circuit, and a control signal generation circuit. The duty cycle detection circuit detects a duty cycle of the pulse width modulation signal by sampling the pulse width modulation signal with a clock signal, and outputs a count signal. The compensation circuit is coupled to the duty cycle detection circuit, and adjusts a pulse number of the count signal according to an offset signal in a self-test period. The control signal generation circuit is coupled to the compensation circuit, calculates an average value of the count signal, and compares the average value with multiple threshold values to respectively generate multiple control signals. The control signals are configured to indicate a leakage current state of the fluxgate device.

Based on the above, the leakage current detection circuit proposed by the disclosure may be suitable for any equipment having a fluxgate device (such as an electric vehicle). The leakage current detection circuit calculates the duty cycle of the pulse width modulation signal and outputs the count signal according to the pulse width modulation signal generated by the inverter circuit, and then generates the control signals according to the average value of the count signal, so as to indicate the leakage current state of the fluxgate device. In this way, safety during usage of the equipment can be increased.

To make the abovementioned more comprehensible, several embodiments accompanied by drawings are described in detail as follows.

DESCRIPTION OF THE EMBODIMENTS

Figure 1:
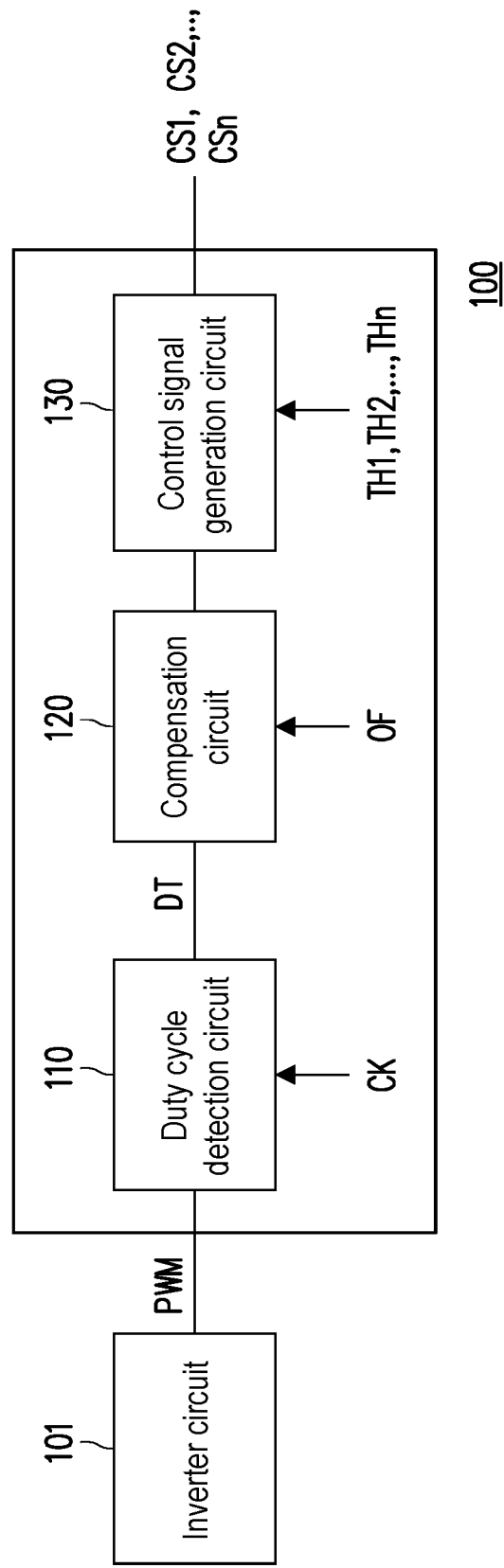
FIG. 1 is a schematic diagram of a fluxgate driver according to an embodiment of the disclosure.

With reference to FIG. 1, FIG. 1 is a schematic diagram of a leakage current detection circuit according to an embodiment of the disclosure. In the embodiment shown in FIG. 1, an inverter circuit 101 may generate a pulse width modulation signal PWM according to an output signal of a fluxgate device, and a leakage current detection circuit 100 may generate control signals CS1 to CSn according to the pulse width modulation signal PWM, so as to indicate an leakage current state of the fluxgate device. In the embodiment, the leakage current detection circuit 100 includes a duty cycle detection circuit 110, a compensation circuit 120, and a control signal generation circuit 130. The duty cycle detection circuit 110 may be coupled to the inverter circuit 101, and detects a duty cycle of the pulse width modulation signal PWM by sampling the pulse width modulation signal PWM with a clock signal CK, and outputs a count signal DT. A frequency of the clock signal CK is greater than a frequency of the pulse width modulation signal PWM. In some embodiments, the compensation circuit 120 may be coupled to the duty cycle detection circuit 110, and adjust a pulse number of the count signal DT according to an offset signal OF in a self-test period. In some embodiments, the control signal generation circuit 130 may be coupled to the compensation circuit 120 to calculate an average value of the count signal DT adjusted by the compensation circuit 120, and the average value may be compared with threshold values TH1 to THn to generate control signals CS1 to CSn, so as to indicate the leakage current state of the fluxgate device.

In some embodiments, the inverter circuit 101 may use a bridge inverter circuit, or other inverter circuits, or combinations thereof. The duty cycle detection circuit 110 may be implemented using a combination of a sampling circuit and an operation circuit. The compensation circuit 120 may be implemented using a combination of a filter, a sensor, and an arithmetic circuit. The control signal generation circuit 130 may be implemented using a combination of an absolute value calculation circuit, an average filter, and a comparison circuit.

It should be noted that in the embodiment, the inverter circuit 101 may generate a pulse width modulation signal PWM represented by a periodic square wave according to the output signal of the fluxgate device. In general, the inverter circuit 101 may output a pulse width modulation signal PWM with a duty cycle (high/low potential ratio) of 50%/50% when there is no leakage current in the fluxgate device. In contrast, the fluxgate device generates a magnetic field, which changes the duty cycle of the pulse width modulation signal PWM outputted by the inverter circuit 101 when a leakage current occurs in the fluxgate device. In some embodiments, the greater a current value of the leakage current, the greater a change value of the duty cycle of the pulse width modulation signal PWM, which is presented as a linear relationship. In this way, the leakage current detection circuit 100 of the disclosure may detect the duty cycle of the pulse width modulation signal PWM and generate the control signals CS1 to CSn, so as to indicate the leakage current state of the fluxgate device.

Figure 2:
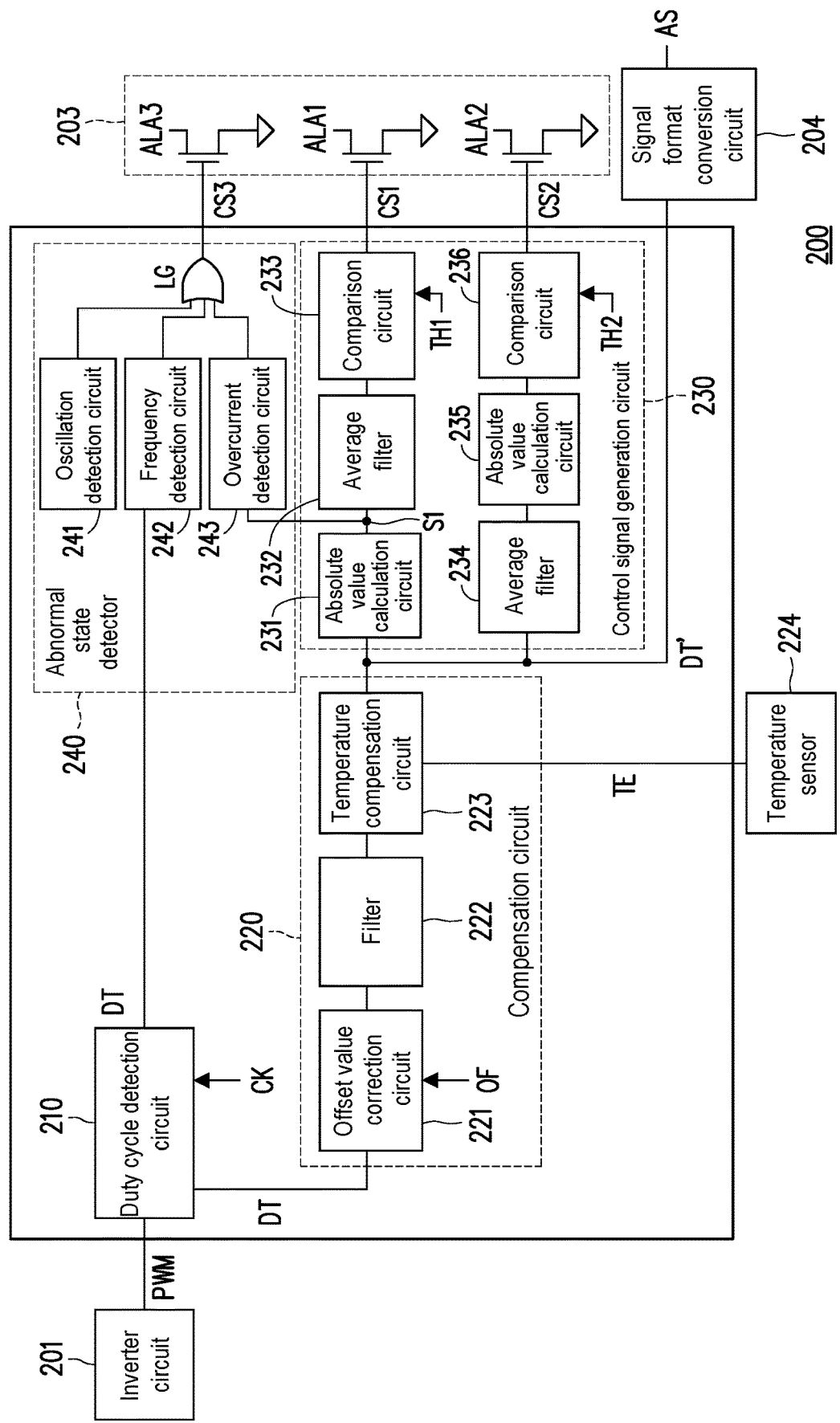
FIG. 2 is a schematic diagram of a leakage current detection circuit according to an embodiment of the disclosure.

With reference to FIG. 2, FIG. 2 is a schematic diagram of a leakage current detection circuit according to another embodiment of the disclosure. In the embodiment shown in FIG. 2, a leakage current detection circuit 200 may be coupled to an inverter circuit 201, and generate the control signals CS1 to CS3 and an adjusted count signal DT'. The control signals CS1, CS2, and CS3 are respectively configured to indicate the leakage current state and an abnormal state of the fluxgate device. In some embodiments, the leakage current detection circuit 200 may be coupled to an error signal output circuit 203 and/or a signal format conversion circuit 204 to output prompt signals ALA1 to ALA3 and/or an analog output signal AS according to the control signals CS1 to CS3, so as to provide a tip, an interpretation, or other applications. In the embodiment, the leakage current detection circuit 200 includes a duty cycle detection circuit 210, a compensation circuit 220, a control signal generation circuit 230, and an abnormal state detector 240. The duty cycle detection circuit 210 is configured to receive the pulse width modulation signal PWM and detect the duty cycle of the pulse width modulation signal PWM by sampling the pulse width modulation signal PWM with the clock signal CK, and then output the count signal DT.

In the embodiment, the compensation circuit 220 may receive the count signal DT and generate the count signal DT' with an adjusted pulse number. In some embodiments, the compensation circuit 220 may include at least one of an offset value correction circuit 221, a filter 222, and a temperature compensation circuit 223. In some embodiments, the offset correction circuit 221 may be coupled to the duty cycle detection circuit 210 to receive the count signal DT, and may adjust the pulse number of the count signal DT according to the offset signal OF in the self-test period. In some embodiments, the offset value correction circuit 221 may be a dynamic offset correlation (DOC) circuit. The offset signal OF may be, for example, preset or inputted by a user, or may be dynamically set according to the pulse width modulation signal PWM in an initial period after the fluxgate device is powered on (power ON).

In some embodiments, the filter 222 may be coupled to the offset correction circuit 221 to filter out noise of the count signal DT. The temperature compensation circuit 223 may be coupled to the filter 222, and receives an ambient temperature TE through a temperature sensor 224 disposed around (or within) the leakage current detection circuit 200, and then adjusts (such as an addition operation and a subtraction operation) the pulse number of the count signal DT according to the ambient temperature TE, so as to generate the count signal DT'.

In the embodiment, the control signal generation circuit 230 may be coupled to the compensation circuit 220 to receive the adjusted count signal DT' and generate the control signals CS1 and CS2. In some embodiments, the control signal generation circuit 230 may include an absolute value calculation circuit 231, an average filter 232, and a comparison circuit 233 only. The absolute value calculation circuit 231 may perform an absolute value operation on the count signal DT' to generate a non-negative first signal S1. The average filter 232 may be coupled to the absolute value calculation circuit 231, and performs low-pass filtering of the first signal S1 to obtain an average value of the first signal S1. For example, when an input signal is an alternating current (AC) signal having a positive value and a negative value, the negative value in the AC signal may be converted into a positive value through the absolute value calculation circuit 231, and then a direct current (DC) like average value signal is outputted through the average filter 232. The comparison circuit 233 may be coupled to the average filter 232, and generate the control signal CS1 after comparing the threshold value TH1 with an average value of the first signal S1. For example, a logic high potential may be outputted when the input signal is greater than or equal to the threshold value TH1, and vice versa.

In some embodiments, the control signal generation circuit 230 may further include an average filter 234, an absolute value calculation circuit 235, and a comparison circuit 236. The average filter 234 may perform low-pass filtering of the count signal DT' to obtain an average value of the count signal DT'. The absolute value calculation circuit 235 may be coupled to the average filter 234, and obtain an absolute value of the average value. For example, the average value may be first outputted through the average filter 234, and then the absolute value is obtained through the absolute value calculation circuit 235 when the input signal is a direct current (DC) signal. The comparison circuit 236 may be coupled to the absolute value calculation circuit 235, and generates the control signal CS2 according to the threshold value TH2 and an average value of a non-negative input signal. The threshold values TH1 and TH2 may be preset or inputted by the user. In some embodiments, the threshold value TH1 may be set to 30 milliamperes (mA), and the threshold value TH2 may be set to 6 milliamperes (mA).

In some embodiments, the abnormal state detector 240 may be coupled to the duty cycle detection circuit 210 and/or the control signal generation circuit 230, and generates the control signal CS3. In some embodiments, the abnormal state detector 240 may include at least one of an oscillation detection circuit 241, a frequency detection circuit 242, and an overcurrent detection circuit 243. In some embodiments, a logic circuit LG may further be included. The oscillation detection circuit 241, the frequency detection circuit 242, and the overcurrent detection circuit 243 may be preset or inputted by the user with threshold values of different conditions, so as to determine the abnormal state. In the embodiment, the oscillation detection circuit 241 may be coupled to a clock source of the fluxgate device, so as to detect whether the fluxgate device has an abnormal oscillation. For example, when the oscillation detection circuit 241 detects that the clock source has no output frequency or the frequency is lower than a preset threshold value, it may mean that the fluxgate device is not well-connected or the circuit is not well-soldered, resulting in an abnormal state such as no oscillation or a paused oscillation. At this time, the oscillation detection circuit 241 may generate an abnormal oscillation signal.

In some embodiments, the frequency detection circuit 242 may be coupled to the duty cycle detection circuit 210, and determine whether the fluxgate device has a frequency abnormality according to the count signal DT. For example, an abnormal frequency signal may be generated when the frequency detection circuit 242 determines that an output frequency of the fluxgate device is higher (or lower) than a preset threshold value. In some embodiments, the overcurrent detection circuit 243 may be coupled to the control signal generation circuit 230, so as to detect an overcurrent state of the fluxgate device. For example, the overcurrent detection circuit 243 may be coupled to the absolute value calculation circuit 231 in the control signal generation circuit 230, so as to receive the adjusted pulse number and the first signal S1 after performing the absolute value calculation. The overcurrent detection circuit 243 may generate an abnormal current signal when it determines that a current of the first signal S1 is greater than a preset threshold value. In the embodiment, the logic circuit LG may be coupled to output terminals of the oscillation detection circuit 241, the frequency detection circuit 242, and the overcurrent detection circuit 243, and may generate the control signal CS3 according to the abnormal oscillation signal, the abnormal frequency signal, and the abnormal current signal. For example, the logic circuit LG may be an OR gate circuit, a NOR gate circuit, or other logic gate circuits, or a combination thereof.

In some embodiments, the leakage current detection circuit 200 may be coupled to the error signal output circuit 203. The error signal output circuit 203 may generate the corresponding prompt signals ALA1 to ALA3 according to any one of the control signals CS1 to CS3, so as to issue a warning when a leakage current or an abnormal state occurs in the fluxgate device. For example, the error signal output circuit 203 may be multiple buffer circuits (such as a pull-up circuit, a pull-down circuit, or a combination thereof). The error signal output circuit 203 may further include a buzzer, a light-emitting diode or other warning circuit to generate a sound and/or a light prompt signal.

In some embodiments, the leakage current detection circuit 200 may be coupled to the signal format conversion circuit 204. The signal format conversion circuit 204 may convert the count signal DT' adjusted by the compensation circuit 220 from a digital format to an analog format, and output the analog voltage signal AS for interpretation or operation in other subsequent processing. In other embodiments, the error signal output circuit 203 and/or the signal format conversion circuit 204 may also be disposed in the leakage current detection circuit 200, which is not limited by the embodiment.

Figure 3:
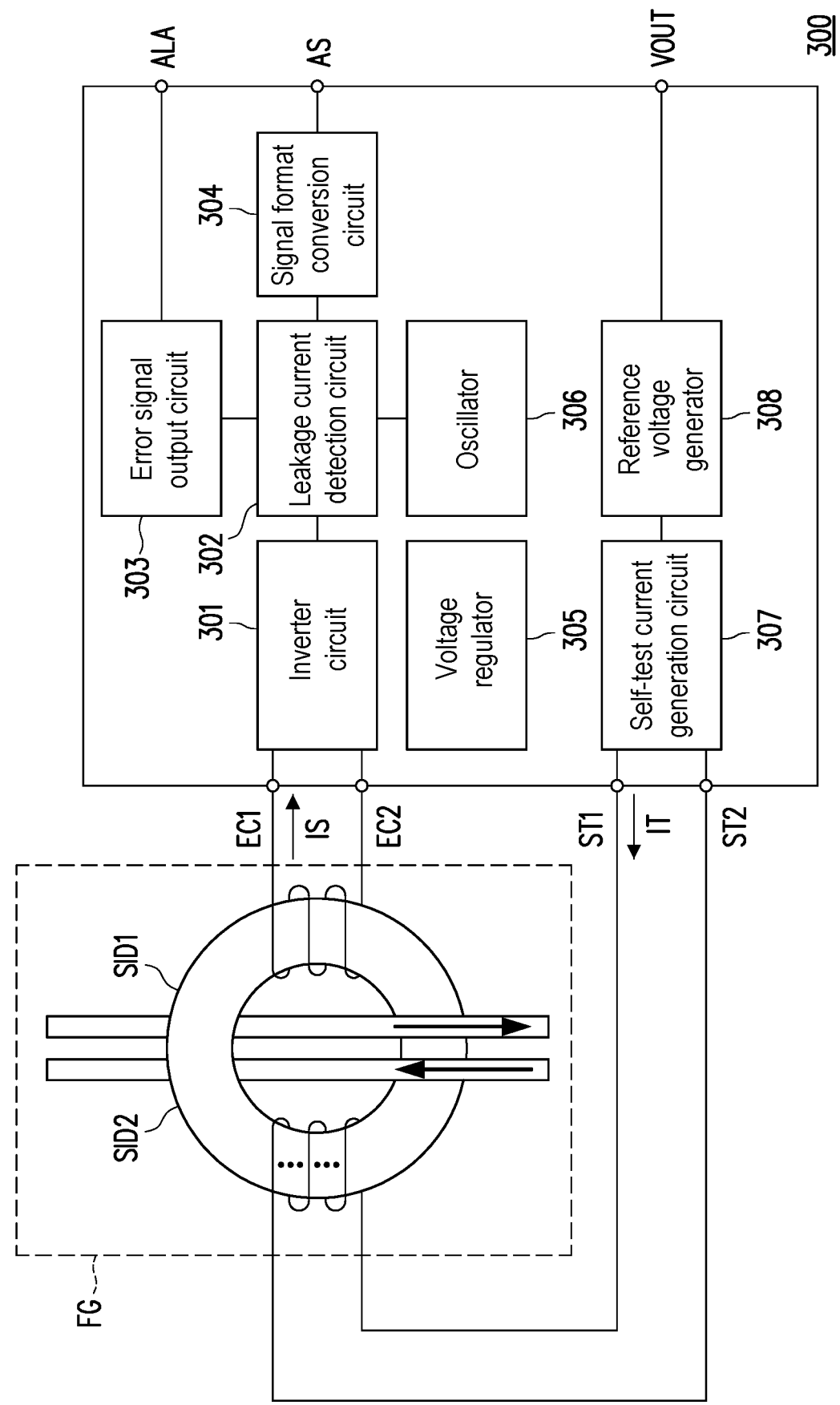
FIG. 3 is a schematic diagram of a leakage current detection circuit according to another embodiment of the disclosure.

With reference to FIG. 3, FIG. 3 shows a schematic diagram of a fluxgate driver according to an embodiment of the disclosure. In the embodiment shown in FIG. 3, a fluxgate device FG has two sets of coils, a first side SID1 and a second side SID2. A fluxgate driver 300 has input terminals EC1 and EC2 that may be coupled to the first side SID1 of the fluxgate device FG, so as to receive an induced current IS on the first side SID1. In some embodiments, the fluxgate driver 300 may also have output terminals ST1 and ST2 that may be coupled to the second side SID2 of the fluxgate device FG, so as to output a self-test current IT to the second side SID2, to enable the fluxgate device FG to generate the induced current IS on the first side SID1 according to the self-test current IT on the second side SID2. In the embodiment, the fluxgate driver 300 includes an inverter circuit 301, a leakage current detection circuit 302, an error signal output circuit 303, a signal format conversion circuit 304, a voltage regulator 305, an oscillator 306, a self-test current generation circuit 307, and a reference voltage generator 308. Reference may be made to the related descriptions of the leakage current detection circuit 200, the error signal output circuit 203, and the signal format conversion circuit 204 shown in FIG. 2 for implementation of the leakage current detection circuit 302, the error signal output circuit 303, and the signal format conversion circuit 304 shown in FIG. 3, which is not repeated here.

In the embodiment, the inverter circuit 301 may receive the induced current IS and generate a pulse width modulation signal. The leakage current detection circuit 302 may generate multiple control signals according to the pulse width modulation signal. In some embodiments, the error signal output circuit 303 and/or the signal format conversion circuit 304 may respectively generate the prompt signal ALA and/or the analog output signal AS according to the multiple control signals outputted by the leakage current detection circuit 302, so as to indicate a leakage current and/or an abnormal state of the fluxgate device FG In some embodiments, the voltage regulator 305 may be configured to perform stabilization on any voltage signal in the fluxgate driver 300. For example, the voltage regulator 305 may be a low-dropout regulator (LDO). In some embodiments, the oscillator 306 may be configured to generate a clock signal for the leakage current detection circuit 302 to determine a leakage current state.

In some embodiments, the self-test current generation circuit 307 may be configured to generate the self-test current IT, which is outputted to the second terminal SID2 of the fluxgate device FG through the output terminals ST1 and ST2 of the fluxgate driver 300. In some embodiments, the self-test current generation circuit 307 may generate a DC signal in a first self-test period, and generate an AC signal in a second self-test period. Starting times, time lengths, implementation sequences, or period intervals of the first self-test period and the second self-test period are not limited by the embodiment. For example, a self-test may be performed in a period (or after a period of time or any other set period) after the fluxgate device FG is powered on, and the first self-test period is performed first, followed by the second self-test period, and vice versa. The first self-test period and the second self-test period may be performed continuously or discontinuously. In some embodiments, the reference voltage generator 308 may be configured to generate and output a reference voltage VOUT.

Figure 4:
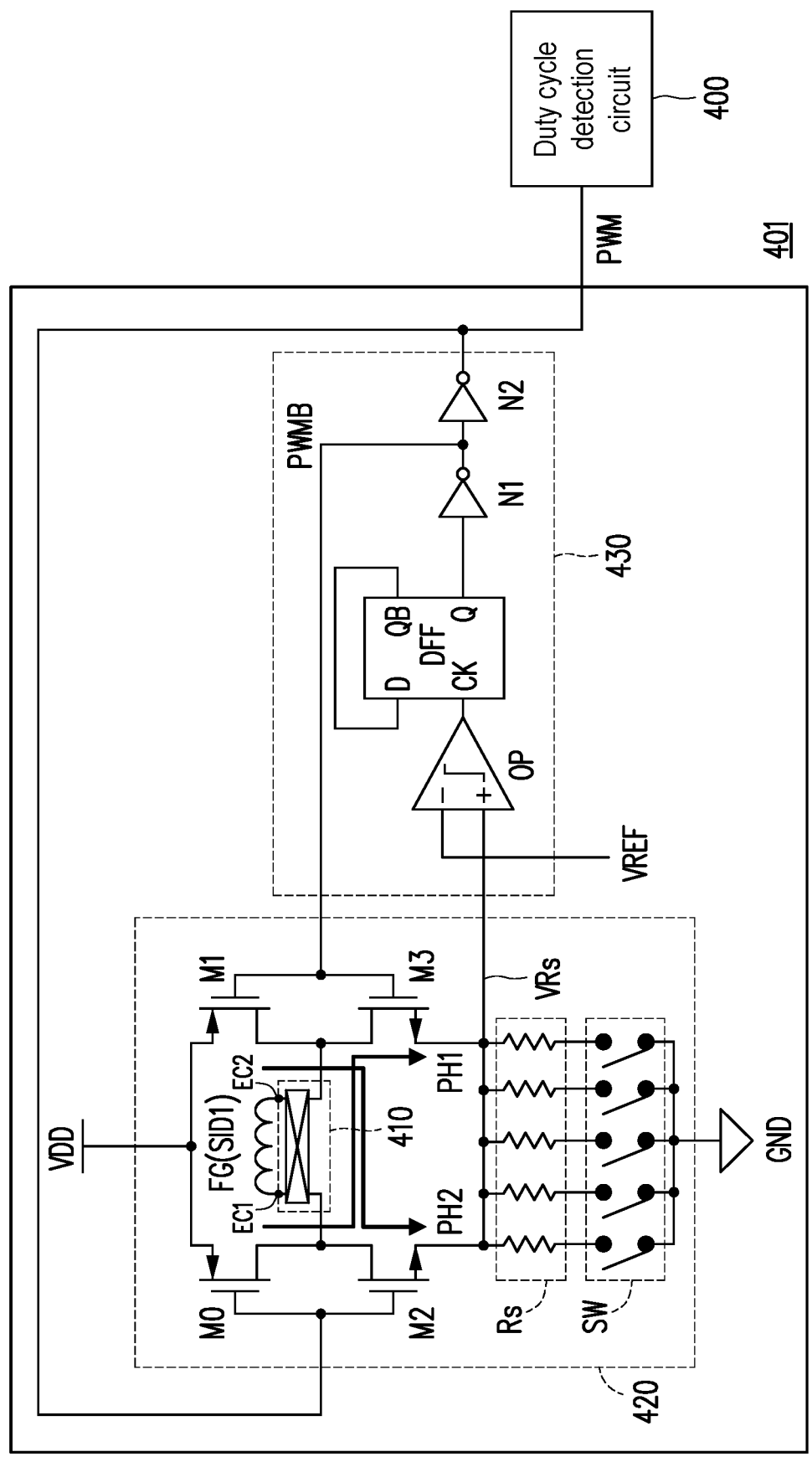
FIG. 4 is a schematic diagram of an inverter circuit according to an embodiment of the disclosure.
Figure 5:
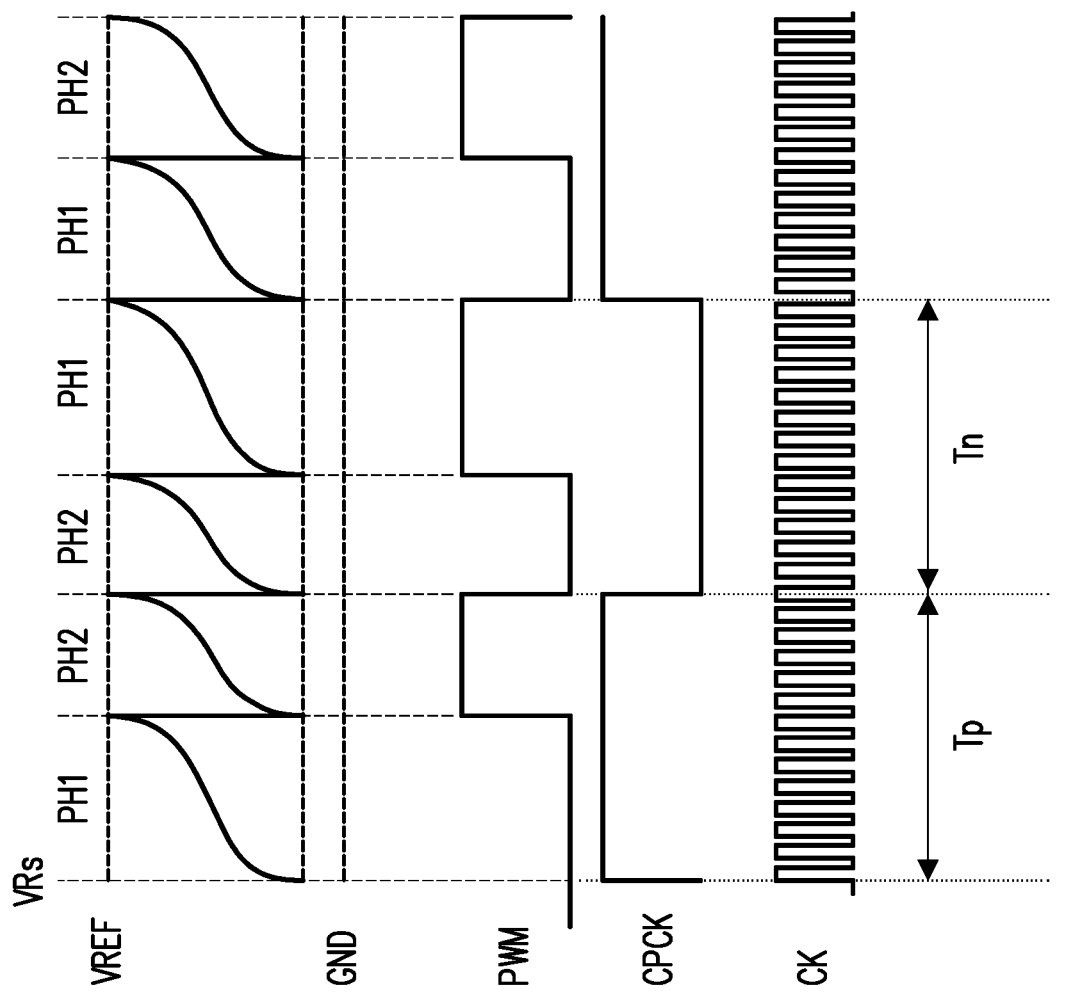
FIG. 5 is an operation waveform diagram of an inverter circuit according to an embodiment of the present invention.

With reference to FIGS. 4 and 5, FIG. 4 is a schematic diagram of an inverter circuit according to an embodiment of the disclosure and FIG. 5 is an operation waveform diagram of an inverter circuit according to an embodiment of the disclosure. In the embodiment shown in FIG. 4, an inverter circuit 401 may receive an output signal on the first side SID1 of the fluxgate device FG through the input terminals EC1 and EC2, and generate the pulse width modulation signal PWM to a duty cycle detection circuit 400. In the embodiment, the inverter circuit 401 includes a chopper switch circuit 410, an H-bridge circuit 420, and a pulse width modulation signal generator 430. The chopper switch circuit 410 may be coupled between the fluxgate device FG and the H-bridge circuit 420, and configured to switch a polarity of an input signal. The H-bridge circuit 420 may use multiple switch circuits and the pulse width modulation signal PWM to switch between different conducting paths PH1 and PH2, so as to generate a ramp signal VRs according to the output signal of the fluxgate device FG The pulse width modulation signal generator 430 may be coupled to the H-bridge circuit 420, and generates the pulse width modulation signal PWM according to the ramp signal VRs. In detail, the H-bridge circuit 420 includes transistors M0 to M3, resistors Rs, and a switch SW, and has a power terminal, a ground terminal, and a load terminal to respectively receive an operating power VDD, and a ground power GND, and outputs the ramp signal VRs. Actual element numbers of the transistors M0 to M3, the resistor Rs, and the switch SW are not limited by the embodiment. In some embodiments, the resistor Rs is coupled between the load terminal and the ground terminal of the H-bridge circuit 420. In some embodiments, there may be the switch SW between the resistor Rs and the ground terminal of the H-bridge circuit 420, so as to adjust sensitivity of the leakage current detection. In the embodiment, first terminals of the transistors M0 and M1 are jointly coupled to the power terminal. Second terminals of the transistors M0 and M1 are respectively coupled to two output terminals of the chopper switch circuit 410. A first terminal of the transistor M2 is coupled to the second terminal of the transistor M0. A first terminal of the transistor M3 is coupled to the second terminal of the transistor M1. Second terminals of the transistors M2 and M3 are jointly coupled to the load terminal. Control terminals of the transistors M0 and M2 jointly receive the pulse width modulation signal PWM. Control terminals of the transistors M1 and M3 jointly receive an operation signal PWMB. In the embodiment, conductivity types of the transistors M0 and M1 are P-type, and conductivity types of the transistors M2 and M3 are N-type, which enables conduction states of the transistors M0 and M3 to be opposite to conduction states of the transistors M1 and M2. Other types of combinations may also be used in other embodiments, which are not limited by this embodiment.

In the embodiment, the pulse width modulation signal generator 430 may include a comparator OP, a switch circuit DFF, and inverters N1 and N2. The comparator OP, the switch circuit DFF, and the inverters N1 and N2 may be sequentially coupled to an output terminal of the H-bridge circuit 420, and receive the ramp signal VRs and a reference voltage signal VREF. In the embodiment, the comparator OP may find a voltage difference between the ramp signal VRs and the reference voltage signal VREF through comparison. The reference voltage signal VREF may be preset or inputted by the user. In the embodiment, the switch circuit DFF may generate an output signal according to an output of the comparator OP. The inverters N1 and N2 may respectively perform a primary inversion processing and a secondary inversion processing on the output signal of the switch circuit DFF, so as to output the operation signal PWMB and the pulse width modulation signal PWM with opposite logic levels. In this way, the H-bridge circuit 420 may alternately switches between on-off states of the transistors M0 to M3 according to the operation signal PWMB and the pulse width modulation signal PWM, so as to switch between the conducting paths PH1 and PH2 of the H-bridge circuit 420. For example, in the embodiment, the transistors M0 and M3 are turned on (the transistors M1 and M2 are turned off, and the conducting path PH1 may be formed between the power terminal of the H-bridge circuit 420, the transistors M0 and M3, and the load terminal when the pulse width modulation signal PWM is at a logic low potential and the operation signal PWMB is at a logic high potential. In contrast, the transistors M1 and M2 are turned on (the transistors M0 and M3 are turned off), and the conducting path PH2 may be formed between the power terminal of the H-bridge circuit 420, the transistors M1 and M2, and the load terminal when the pulse width modulation signal PWM is at a logic high potential and the operation signal PWMB is at a logic low potential.

As for a waveform diagram of the above operations, reference may be made to FIG. 5. For convenience of description, it is assumed that an initial output of the switch circuit DFF is at a logic low potential. At this time, the pulse width modulation signal PWM is at a logic low potential and the operation signal PWMB is at a logic high potential. The output signal of the device FG may first charge the load terminal of the H-bridge circuit 420 via the conducting path PH1, so that a voltage value of the ramp signal VRs on the load terminal gradually increases from an initial low voltage value (such as greater than the ground power GND and less than the reference voltage signal VREF, but is not limited by the embodiment). When the voltage value of the ramp signal VRs is equal to a voltage value of the reference voltage signal VREF, the switch circuit DFF may change the output signal from the logic low potential to a logic high potential according to a change in the output of the comparator OP. Then, the logic potentials of the operation signal PWMB and the pulse width modulation signal PWM reverse and the ramp signal VRs changes from a charging state to a discharging state. At this time, the conducting path of the H-bridge circuit 420 changes from the conducting path PH1 to the conducting path PH2 and a reverse current is generated to recharge the load terminal of the H-bridge circuit 420. In this way, the ramp signal VRs is formed over and over again.

In the embodiment, the chopper switch circuit 410 may switch a polarity of the output signal of the fluxgate device FG (as shown by a clock signal CPCK) after a complete cycle (that is, the logic level is switched twice) of the pulse width modulation signal PWM is outputted. The duty cycle detection circuit 400 may calculate a pulse number of the pulse width modulation signal PWM by sampling the pulse width modulation signal PWM with the clock signal CK. Assuming that sampling results in different duty cycles Tp and Tn are respectively pulse numbers DTp+DOF and −DTn+DOF, the pulse width modulation signals PWMs corresponding to the pulse numbers DTp and −DTn are inverse to each other, and an offset number DOF represents a pulse number offset due to circuit noise (such as temperature drift) of the inverter circuit 401 and is in phase, in this way, the duty cycle detection circuit 400 may subtract the pulse numbers of the pulse width modulation signals PWM in the different duty cycles Tp and Tn ((DTp+Doffset)−(−DTn+Doffset)=DTp+DTn), so as to eliminate the pulse offset number DOF due to the circuit noise and calculate the pulse numbers DTp and DTn of the duty cycle.

Figure 6:
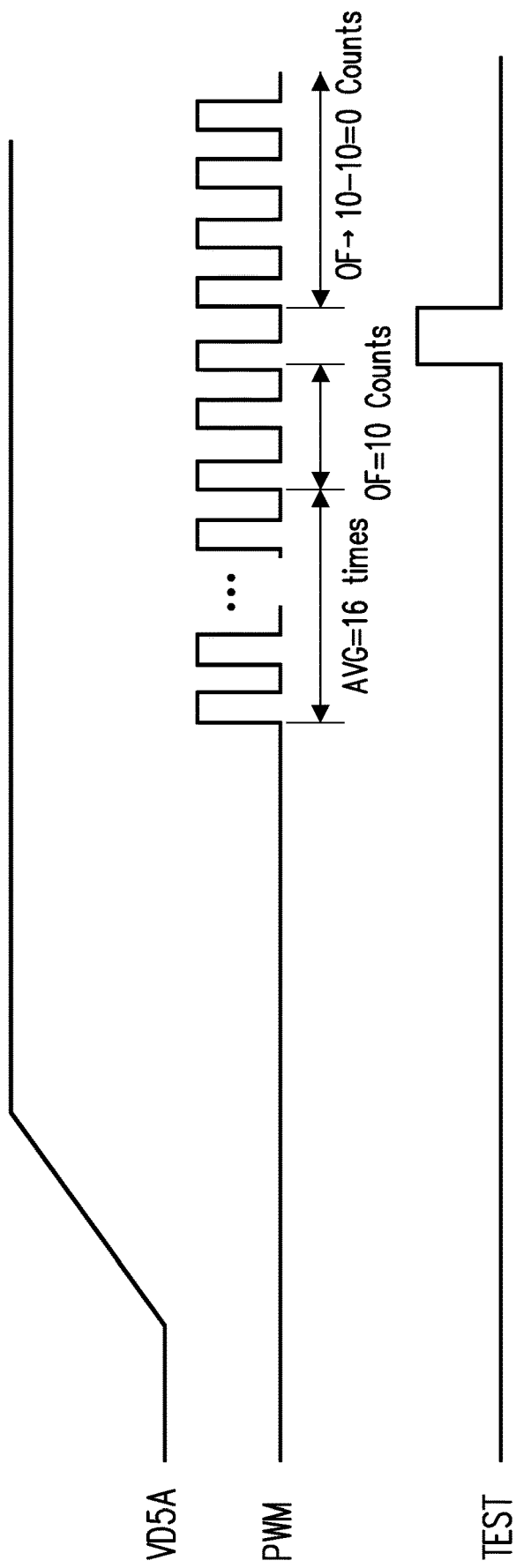
FIG. 6 shows an operation waveform diagram of the pulse width modulation signal according to an embodiment of the disclosure.

With reference to FIG. 6, FIG. 6 shows an operation waveform diagram of the pulse width modulation signal according to an embodiment of the disclosure. In the embodiment shown in FIG. 6, a voltage value VD5A of a voltage terminal of the fluxgate device gradually increases after the fluxgate device is powered on. Assuming that there is no leakage current outputted when the power is powered on and the inverter circuit starts to output the pulse width modulation signal PWM after being powered on for a period of time, then the leakage current detection circuit of the disclosure may measure a number of the duty cycles AVG and an average pulse number of the pulse width modulation signal PWM, so as to generate the offset signal OF. For example, in the embodiment, an example of a self-test pulse signal TEST is used to start a self-test period. The leakage current detection circuit may measure the number of the duty cycles AVG of the pulse width modulation signal PWM in an initial period before the self-test period to be 16 and calculate the average pulse number to be 10, then the leakage current detection circuit may set the offset signal OF to 10. In some embodiments, the leakage current detection circuit may adjust the pulse number of the count signal according to the offset signal OF in the self-test period, and reset the offset signal OF to zero after the self-test period ends.

Figure 7:
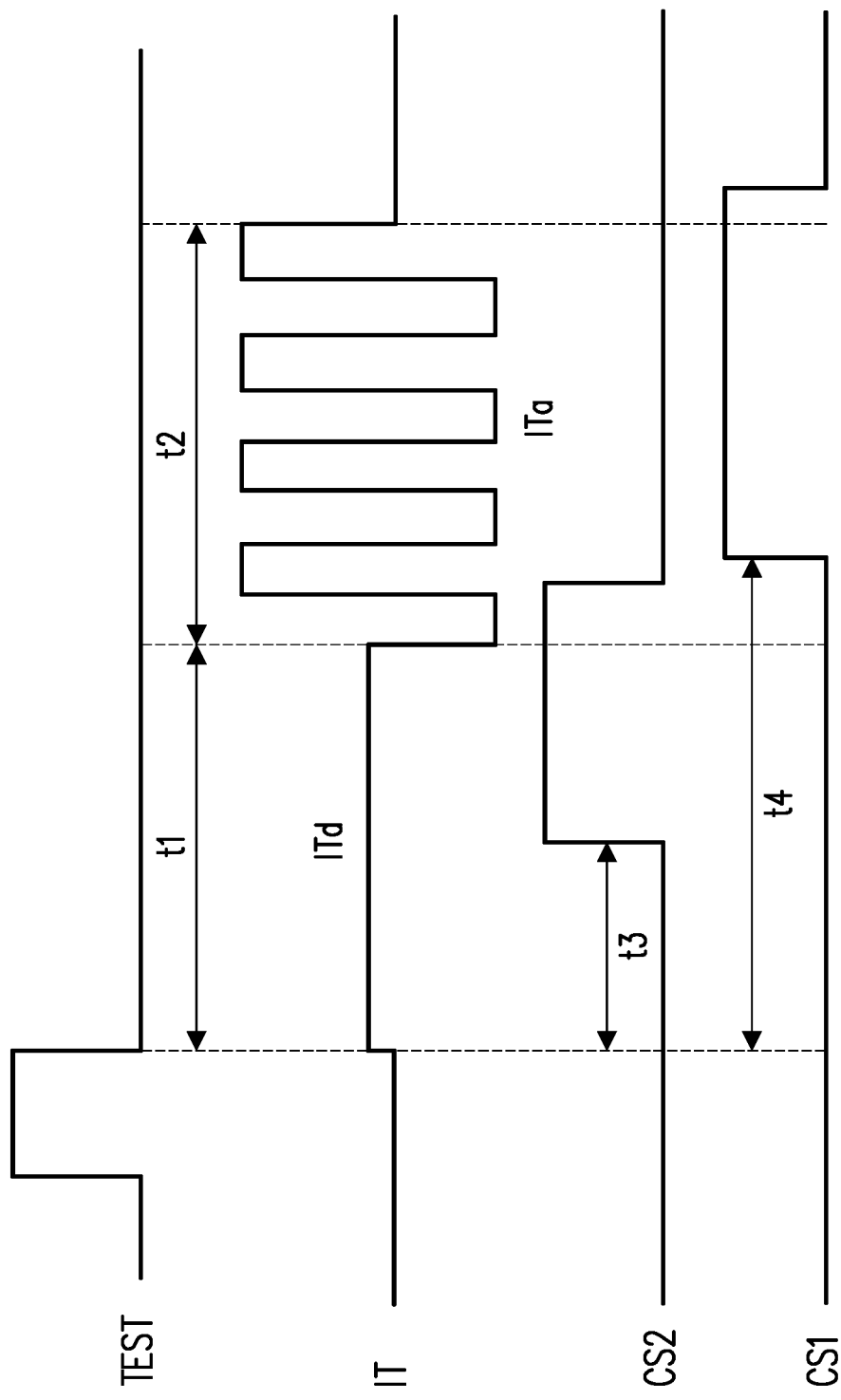
FIG. 7 shows an operation waveform diagram of the self-test period according to an embodiment of the disclosure.

FIG. 7 is a schematic diagram of an operation waveform of the self-test period according to an embodiment of the disclosure. In the embodiment shown in FIG. 7, after the self-test period is started with the example of the self-test pulse signal TEST, the self-test current generation circuit may generate the self-test current IT to the fluxgate device, so as to perform the leakage current detection. For example, a DC signal ITd may be generated in a self-test period t1 and an AC signal ITa may be generated in a self-test period t2, respectively. In the self-test period (t1+t2), the leakage current detection circuit may output the control signals CS1 and CS2 when the fluxgate device has a leakage current. For example, in the embodiment, a pull-up (or pull-down) signal may be outputted after time intervals t3 and t4, so as to indicate the leakage current state of the fluxgate device.

In summary, the leakage current detection circuit and fluxgate driver proposed in the disclosure may receive the pulse width modulation signal generated by the inverter circuit according to the output signal of the fluxgate device, and detects the duty cycle of the pulse width modulation signal to generate the multiple control signals, so as to indicate the leakage current state of the fluxgate device. In this way, safety during usage of the equipment can be increased.

Although the disclosure has been described with reference to the abovementioned embodiments, but it is not intended to limit the disclosure. It is apparent that any one of ordinary skill in the art may make changes and modifications to the described embodiments without departing from the spirit and the scope of the disclosure. Accordingly, the scope of the disclosure is defined by the claims appended hereto and their equivalents in which all terms are meant in their broadest reasonable sense unless otherwise indicated.

What is claimed is:

1. A leakage current detection circuit, suitable for a fluxgate device, comprising:
    a duty cycle detection circuit, and configured to receive a pulse width modulation signal from an inverter circuit, detect a duty cycle of the pulse width modulation signal by sampling the pulse width modulation signal with a clock signal, and output a count signal;
    a compensation circuit, coupled to the duty cycle detection circuit and configured to adjust a pulse number of the count signal according to an offset signal in a self-test period; and
    a control signal generation circuit, coupled to the compensation circuit, and configured to calculate an average value of the count signal and compare the average value with a plurality of threshold values to respectively generate a plurality of control signals,
    wherein the control signals are configured to indicate a leakage current state of the fluxgate device.

2. The leakage current detection circuit according to claim 1, wherein the compensation circuit comprises:
    an offset correction circuit, coupled to the duty cycle detection circuit, and configured to generate the offset signal according to an average pulse number of the pulse width modulation signal in an initial period and adjust the pulse number of the count signal according to the offset signal in the self-test period; and
    a filter, coupled to the offset correction circuit and configured to filter out a noise of the count signal.

3. The leakage current detection circuit according to claim 2, wherein the compensation circuit further comprises:
    a temperature compensation circuit, coupled to the filter, and configured to receive an ambient temperature through a temperature sensor and adjust the pulse number of the count signal according to the ambient temperature.

4. The leakage current detection circuit according to claim 1, wherein the control signal generation circuit comprises:
    a first absolute value calculation circuit, coupled to the compensation circuit;
    a first average filter, coupled to the first absolute value calculation circuit; and
    a first comparison circuit, coupled to the first average filter and configured to generate a first control signal according to a first threshold value.

5. The leakage current detection circuit according to claim 4, wherein the control signal generation circuit further comprises:
    a second average filter, coupled to the compensation circuit;
    a second absolute value calculation circuit, coupled to the second average filter; and
    a second comparison circuit, coupled to the second absolute value calculation circuit and configured to generate a second control signal according to a second threshold value.

6. The leakage current detection circuit according to claim 1, further comprising:
    an abnormal state detector, coupled to the duty cycle detection circuit, wherein the abnormal state detector comprises:
        an oscillation detection circuit, configured to detect whether a clock source is abnormal, so as to generate an abnormal oscillation signal;
        a frequency detection circuit, configured to determine whether there is an abnormality according to the count signal, so as to generate an abnormal frequency signal;
        an overcurrent detection circuit, configured to detect an overcurrent state of the fluxgate device, so as to generate an abnormal current signal; and a logic circuit, coupled to the oscillation detection circuit, the frequency detection circuit, and the overcurrent detection circuit, and configured to generate a first control signal according to the abnormal oscillation signal, the abnormal frequency signal, and the abnormal current signal.

7. A fluxgate driver, comprising:
an inverter circuit, coupled to a first side of a fluxgate device and configured to generate a pulse width modulation signal according to an induced current on the first side; and
a leakage current detection circuit, coupled to the inverter circuit and configured to receive the pulse width modulation signal to generate a plurality of control signals, wherein the leakage current detection circuit comprises:
  a duty cycle detection circuit, configured to detect a duty cycle of the pulse width modulation signal by sampling the pulse width modulation signal with a clock signal, and output a count signal;
  a compensation circuit, coupled to the duty cycle detection circuit, and configured to adjust a pulse number of the count signal according to an offset signal in a self-test period; and
  a control signal generation circuit, coupled to the compensation circuit, and configured to calculate an average value of the count signal and compare the average value with a plurality of threshold values to respectively generate the plurality of control signals, wherein the plurality of control signals are configured to indicate a leakage current state of the fluxgate device.

8. The fluxgate driver according to claim 7, wherein the inverter circuit comprises:
  a chopper switch circuit, coupled to the first side of the fluxgate device, configured to switch a phase of the induced current;
  an H-bridge circuit, having a power terminal to receive an operating power and a load terminal coupled to a resistor, wherein the H-bridge circuit generates a ramp signal according to the induced current based on the pulse width modulation signal; and
  a pulse width modulation signal generator, configured to generate the pulse width modulation signal according to the ramp signal.

9. The fluxgate driver according to claim 8, wherein the H-bridge circuit comprises:

a first transistor and a second transistor, wherein first terminals of the first transistor and the second transistor jointly receive the operating power;
a third transistor, wherein its first terminal and a second terminal of the first transistor are jointly coupled to a first terminal of the chopper switch circuit, and control terminals of the first transistor and the third transistor jointly receive the pulse width modulation signal; and
a fourth transistor, wherein its first terminal and a second terminal of the second transistor are jointly coupled to a second terminal of the chopper switch circuit, control terminals of the second transistor and the fourth transistor jointly receive an operation signal, and second terminals of the third transistor and the fourth transistor are jointly coupled to the load terminal,
wherein the resistor is coupled between the second terminal of the fourth transistor and a ground terminal.

10. The fluxgate driver according to claim 8, wherein the pulse width modulation signal generator comprises:
  a comparator, wherein its first terminal receives the ramp signal and a second terminal of the comparator receives a reference voltage signal;
  a switch circuit, coupled to the comparator;
  a first inverter, coupled to the switch circuit; and
  a second inverter, coupled to the first inverter.

11. The fluxgate driver according to claim 7, further comprising:
  a self-test current generation circuit, coupled to a second side of the fluxgate device and configured to generate a self-test current, to enable the fluxgate device to generate the induced current on the second side according to the self-test current.

12. The fluxgate driver according to claim 11, wherein the self-test current generation circuit is capable of generating a direct current signal in a first self-test period and generating an alternating current signal in a second self-test period.

13. The fluxgate driver according to claim 7, further comprising:
  an error signal output circuit, coupled to the leakage current detection circuit and configured to generate a plurality of prompt signals according to the plurality of control signals.

14. The fluxgate driver according to claim 7, further comprising:
  a signal format conversion circuit, coupled to the leakage current detection circuit and configured to convert the count signal from a digital format to an analog format.

* * * * *